(12) United States Patent
Liu et al.

(10) Patent No.: US 12,034,277 B2
(45) Date of Patent: Jul. 9, 2024

(54) SEMICONDUCTOR LAYER STRUCTURE WITH A THIN BLOCKING LAYER

(71) Applicant: Lumentum Operations LLC, San Jose, CA (US)

(72) Inventors: Ting Liu, San Jose, CA (US); Xing Li, San Jose, CA (US); Hery Djie, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 18/326,465

(22) Filed: May 31, 2023

(65) Prior Publication Data

US 2023/0307891 A1    Sep. 28, 2023

Related U.S. Application Data

(63) Continuation of application No. 16/947,876, filed on Aug. 21, 2020, now Pat. No. 11,670,913.

(60) Provisional application No. 63/044,671, filed on Jun. 26, 2020.

(51) Int. Cl.
    *H01S 5/34* (2006.01)
(52) U.S. Cl.
    CPC .......... *H01S 5/3407* (2013.01); *H01S 5/3425* (2013.01)
(58) Field of Classification Search
    CPC ........ H01S 5/3425; H01S 5/3407; H01S 5/34; H01S 5/2013; H01S 2301/173; H01S 5/34326

USPC ..................................................... 372/45.012
See application file for complete search history.

(56) References Cited

U.S. PATENT DOCUMENTS

| | | | |
|---|---|---|---|
| 4,984,242 A * | 1/1991 | Scifres | B82Y 20/00 257/18 |
| 5,153,889 A | 10/1992 | Sugawara et al. | |
| 6,631,150 B1 | 10/2003 | Najda | |
| 11,670,913 B2 | 6/2023 | Liu et al. | |
| 2020/0067280 A1 | 2/2020 | Fan | |

OTHER PUBLICATIONS

Lim H.S., et al., "Effect of Etch Pit Density of InP Substrate On The Stability of InGaAs/InGaAsP Quantum Well Laser Materials", Proceedings of the SPIE, 1999, vol. 3896, pp. 207-212.

* cited by examiner

*Primary Examiner* — Tuan N Nguyen
(74) *Attorney, Agent, or Firm* — Harrity & Harrity, LLP

(57) ABSTRACT

A semiconductor layer structure may include a substrate, a blocking layer disposed over the substrate, and one or more epitaxial layers disposed over the blocking layer. The blocking layer may have a thickness of between 50 nanometers (nm) and 4000 nm. The blocking layer may be configured to suppress defects from the substrate propagating to the one or more epitaxial layers. The one or more epitaxial layers may include a quantum-well layer that includes a quantum-well intermixing region formed using a high temperature treatment.

20 Claims, 5 Drawing Sheets

SEMICONDUCTOR LAYER STRUCTURE WITH A THIN BLOCKING LAYER

RELATED APPLICATION

This application is a continuation of U.S. patent application Ser. No. 16/947,876, filed Aug. 21, 2020 (now U.S. Pat. No. 11,670,913), which claims priority to U.S. Provisional Patent Application No. 63/044,671, filed on Jun. 26, 2020, and entitled "SEMICONDUCTOR DIODE LASER WITH AN INGAP BUFFER LAYER," the content of which is incorporated by reference herein in its entirety.

TECHNICAL FIELD

The present disclosure relates to semiconductor layer structure and, more particularly, to a semiconductor layer structure with a thin blocking layer.

BACKGROUND

A semiconductor laser is formed from various epitaxial layers. The various epitaxial layers are grown on a substrate. The semiconductor laser lases when supplied with electric current. A semiconductor laser may include an edge emitting laser or a vertical emitting laser, such as a vertical cavity surface emitting laser (VCSEL).

SUMMARY

In some implementations, a semiconductor layer structure includes a substrate; a blocking layer disposed over the substrate; and one or more epitaxial layers disposed over the blocking layer, wherein: the blocking layer has a thickness of between 50 nanometers (nm) and 4000 nm, the blocking layer is configured to suppress defects from the substrate propagating to the one or more epitaxial layers, and the one or more epitaxial layers include a quantum-well layer that includes a quantum-well intermixing region formed using a high temperature treatment.

In some implementations, a semiconductor laser includes a substrate; a blocking layer disposed over the substrate; and one or more epitaxial layers disposed over the blocking layer, wherein: the blocking layer has a thickness that is less than or equal to 4 micrometers, and the blocking layer is configured to suppress defects from the substrate propagating to the one or more epitaxial layers during a high temperature treatment for forming at least one of the one or more epitaxial layers.

In some implementations, an optical device includes a substrate; a blocking layer disposed over the substrate; and one or more epitaxial layers disposed over the blocking layer, wherein: the blocking layer has a thickness of between 50 nanometers (nm) and 4000 nm, the blocking layer is lattice-matched with the substrate, the blocking layer is configured to suppress defects from the substrate propagating to the one or more epitaxial layers, and the one or more epitaxial layers include a quantum-well layer that includes a quantum-well intermixing region formed using a high temperature treatment.

DETAILED DESCRIPTION

Figure 1A:
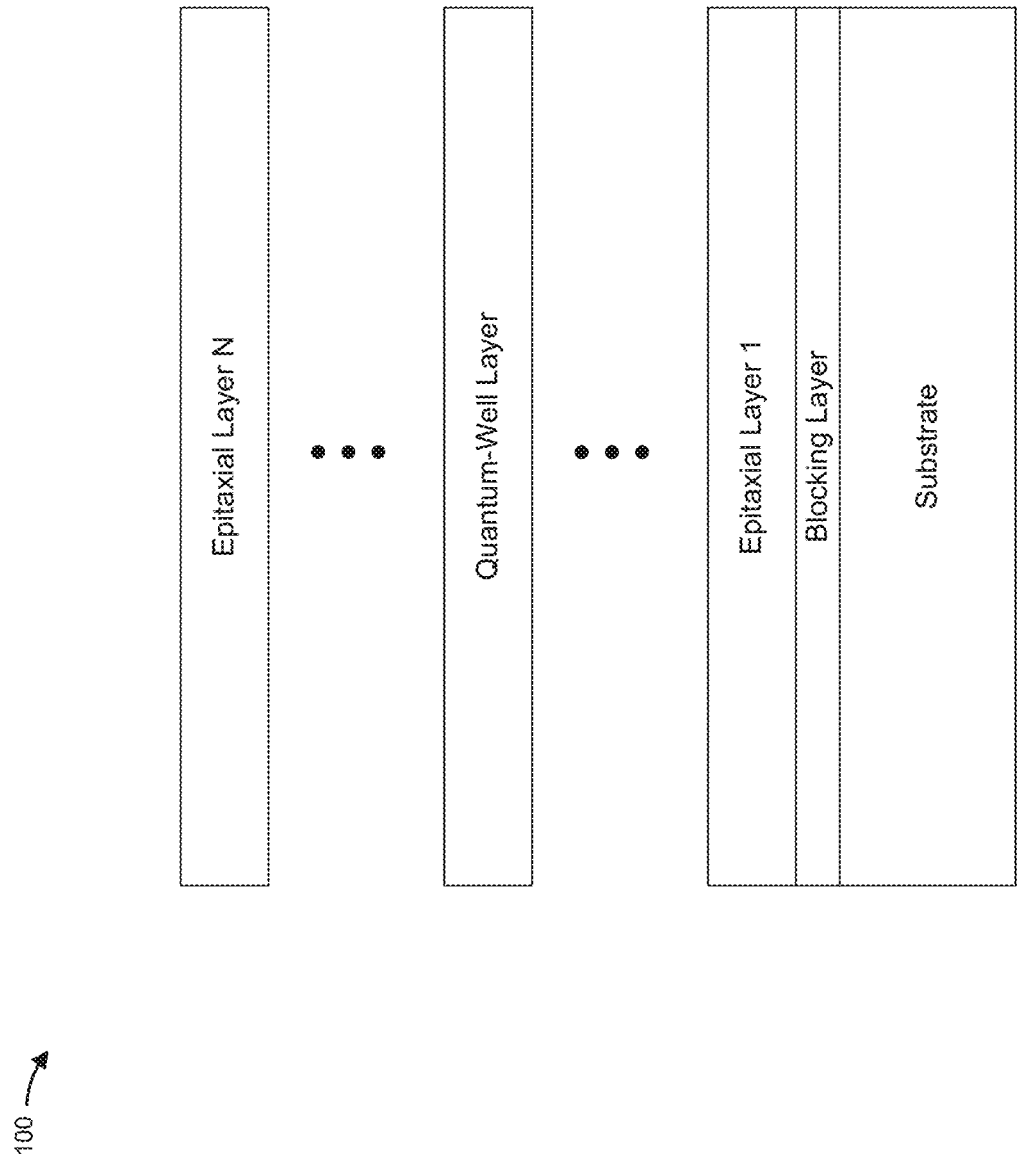
FIGS. 1A-1C are diagrams depicting an example implementation of a semiconductor layer structure with a thin blocking layer described herein.

The following detailed description of example implementations refers to the accompanying drawings. The same reference numbers in different drawings may identify the same or similar elements.

A typical semiconductor laser, such as a high-power laser (HPL), may be formed using a high temperature treatment (e.g., where a semiconductor layer structure of the semiconductor laser is placed in a high temperature environment, such as an environment with a temperature greater than or equal to 500° C., for a period of time, such as multiple seconds, minutes, hours, and/or the like). This can cause defects from a substrate of the semiconductor layer structure to propagate to epitaxial layers, such as a quantum-well and/or quantum-well intermixing region of the quantum-well, which can induce a lasing wavelength shift. Moreover, the lasing wavelength shift may be different for each semiconductor layer structure of a plurality of semiconductor layer structures positioned across the same boule (e.g., the wavelength shift may be dependent on a semiconductor layer structure's location on the boule). Furthermore, a variation in wavelength across the boule may be significant (e.g., semiconductor layer structures from a same boule can experience a wavelength variation of 40 nanometers (nm) or more, depending on the slice number of the semiconductor layer structures from the boule), which can cause low yield for a given wavelength specification (e.g., a range of 20 nm). This can result in a significant yield loss (e.g., up to 40% yield loss) and cause manufacturing of typical semiconductor lasers to be difficult.

Some implementations described herein provide a semiconductor layer structure (e.g., for a semiconductor diode laser) that includes a thin blocking layer. For example, the thin blocking layer may separate a substrate of the semiconductor layer structure and one or more epitaxial layers of the semiconductor layer structure (e.g., the one or more epitaxial layers may be associated with lasing when the semiconductor layer structure is included in a semiconductor laser). The thin blocking layer may have a thickness between 50 nm and 4 μm (greater than or equal to 50 nm and less than 4 μm) and/or may be lattice-matched to the substrate. The thin blocking layer may facilitate a smooth interface for epitaxial growth of the one or more epitaxial layers and thereby suppress defects of the substrate from propagating to (or into) the one or more epitaxial layers grown on the blocking layer. This may provide improved control of lasing wavelength across semiconductor lasers produced from different semiconductor layer structures by reducing or eliminating defects in an active area of the semiconductor layer structure, thereby reducing or eliminating wavelength variability across different semiconductor lasers and/or reducing a likelihood that a wavelength for a semiconductor laser formed from the semiconductor layer structure will have a lasing wavelength outside of a designed wavelength range.

Improved control of lasing wavelength improves production yield of producing semiconductor lasers from a boule by providing improved control of lasing wavelength within a range of wavelengths across different semiconductor lasers formed from different wafers of a boule. Improved yield reduces costs and eliminates waste that would otherwise occur through use of a semiconductor layer structure that does not include a thin blocking layer.

Figure 1B:
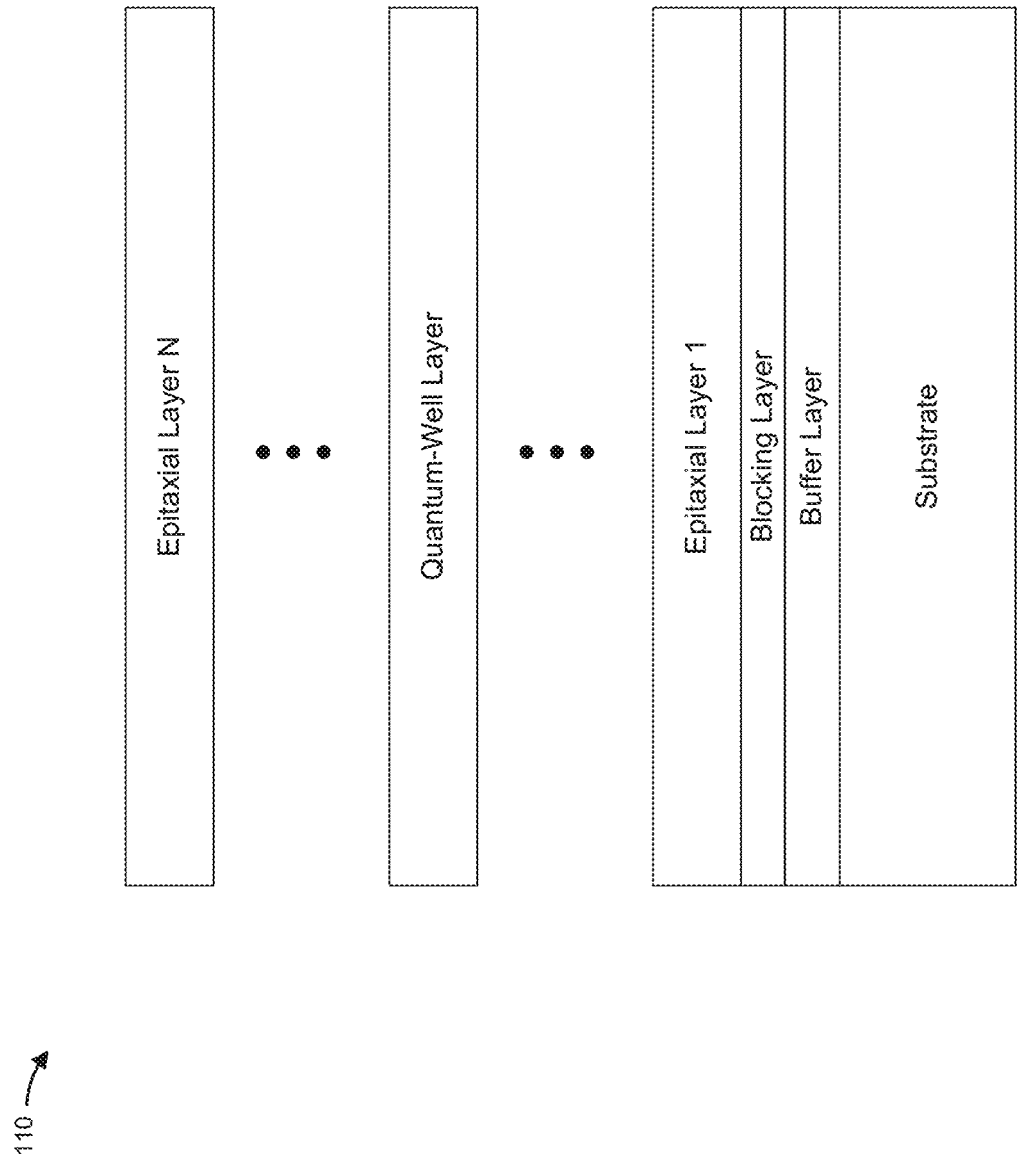
Figure 1C:
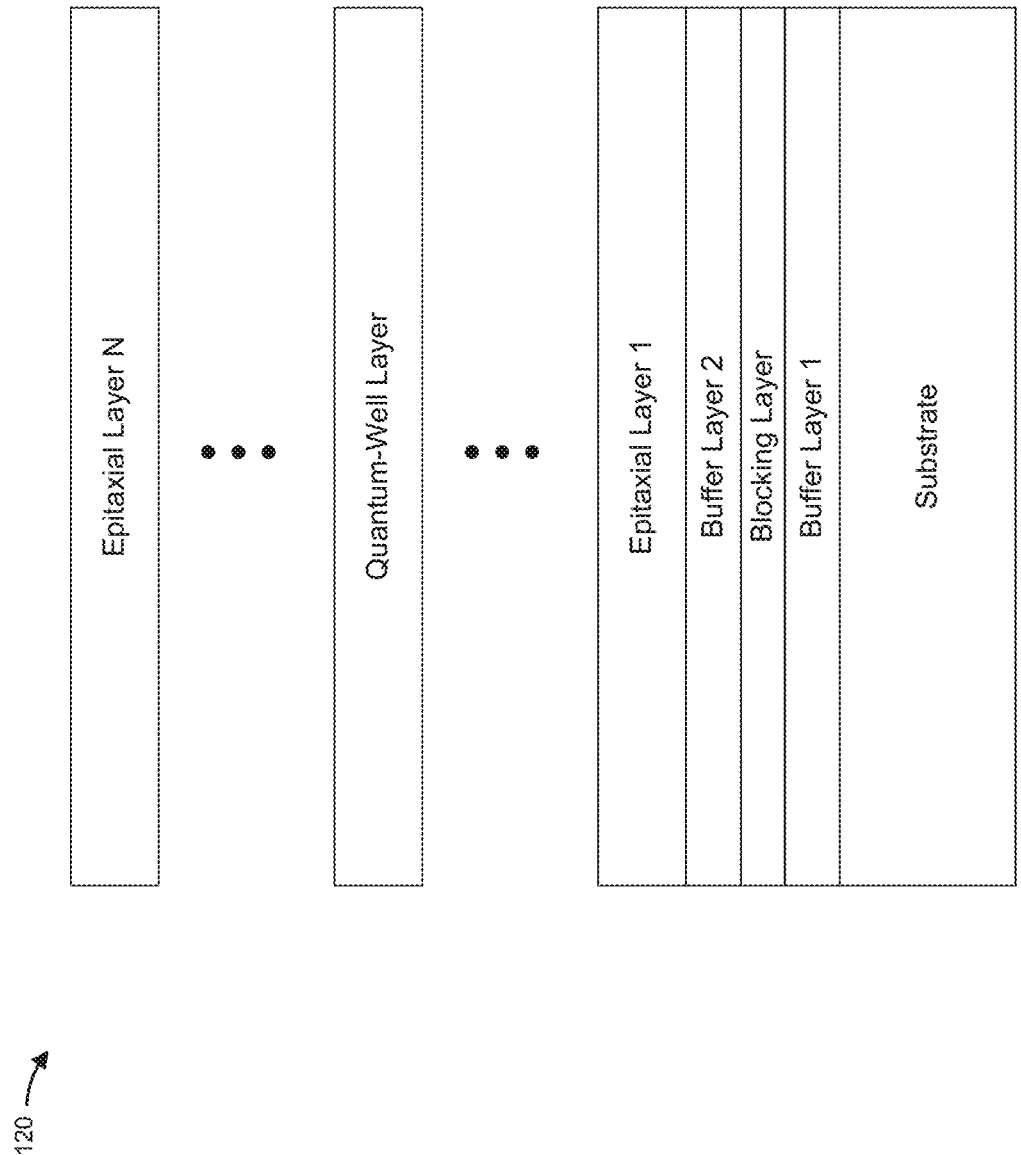

FIGS. 1A-1C are diagrams depicting example implementations 100, 110, and 120 of a semiconductor layer structure with a thin blocking layer described herein. As shown in FIGS. 1A-1C, the semiconductor layer structure may include a substrate. For example, the substrate may be a gallium arsenide (GaAs) substrate and/or the like. Additionally, or alternatively, the substrate may be doped. For example, the substrate may be doped with an n-type dopant or a p-type dopant. In some implementations, the substrate may be doped with a flat doping profile, a graded doping profile, and/or the like. The substrate may be formed from a wafer (e.g., slice) from a boule, and other layers of the semiconductor layer structure may be formed (e.g., grown, deposited, and/or the like) on the substrate.

As further shown in FIGS. 1A-1C, the semiconductor layer structure may include a blocking layer. For example, the blocking layer may be formed (e.g., grown, deposited, and/or the like) on the substrate (e.g., on a formation surface of the substrate), such that the blocking layer is disposed over the substrate. In some implementations, one or more epitaxial layers may be formed between the substrate and the blocking layer in the semiconductor layer structure, such that the one or more epitaxial layers are disposed over the substrate and the blocking layer is disposed over the one or more epitaxial layers. For example, as shown in FIG. 1B, a buffer layer may be formed between the substrate and the blocking layer (e.g., the buffer layer may be formed on the formation surface of the substrate and the blocking layer may be formed on the buffer layer, such that the blocking layer is disposed over the substrate with the buffer layer between the substrate and the blocking layer). As another example, as shown in FIG. 1C, a first buffer layer (shown as buffer layer 1) may be formed between the substrate and the blocking layer and a second buffer layer (shown as buffer layer 2) may be formed on the blocking layer.

The blocking layer may comprise indium gallium phosphide (InGaP); indium aluminum phosphide (InAlP); indium gallium arsenide (InGaAs); aluminum indium gallium phosphide (AlInGaP); indium gallium arsenide phosphide (InGaAsP); and/or the like. For example, the blocking layer may comprise one or more layers, wherein a layer, of the one or more layers, includes InGaP, InAlP, InGaAs, AlInGaP, InGaAsP, and/or the like. In a specific example, the layer may include $In_xGa_{1-x}P$, where x=0.450-0.520; $In_xAl_{1-x}P$, where x=0.440-0.515; $In_xGa_{1-x}As$, where x=0.000-0.004; $Al_yIn_xGa_{1-x-y}P$, where x=0.450-0.520 and y=0.000-0.550 (e.g., where x+y≤1 and/or a ratio between x and y allows the layer to be lattice-matched with the substrate); $In_xGa_{1-x}As_yP_{1-y}$, where x=0.350-0.520 and y=0.000-0.200 (e.g., where x+y≤1 and/or a ratio between x and y allows the layer to be lattice-matched with the substrate); and/or the like. As another example, the blocking layer may comprise an InGaP layer, an InAlP layer, an InGaAs layer, an AlInGaP layer, an InGaAsP layer, and/or the like (e.g., according to the composition formulations described above). In another example, the blocking layer may comprise one or more super lattice layers, wherein a super lattice layer, of the one or more super lattice layers, includes InGaP, InAlP, InGaAs, AlInGaP, InGaAsP, and/or the like (e.g., according to the composition formulations described above).

In some implementations, the blocking layer may be doped. For example, the blocking layer may be doped with an n-dopant (e.g., selenium and/or the like) or a p-dopant. In some implementations, the blocking layer may be doped with a flat doping profile, a graded doping profile, and/or the like.

The blocking layer may have a thickness that is less than a threshold thickness. For example, the blocking layer may have a thickness that is less than 4 micrometers (μm). For example, the blocking layer may have a thickness between 50 nm and 4 μm (greater than or equal to 50 nm and less than 4 μm). In some implementations, the blocking layer may have a thickness that is less than 4 μm across the blocking layer (e.g., the blocking layer has an average thickness that is less than 4 μm across the blocking layer, even when one or more individual portions of the blocking layer have a thickness that is greater than or equal to 4 μm).

The blocking layer may be lattice-matched to the substrate. For example, the substrate and the blocking layer may have matching lattice constants (e.g., respective matching lattice constants that are equal or within 0.6% of a lattice constant difference). This facilitates growth of the blocking layer on the substrate to the thickness described above. This may allow the blocking layer to suppress defects from the substrate propagating to one or more epitaxial layers formed on the blocking layer, as further described below.

One or more epitaxial layers may be formed on the blocking layer. For example, as shown in FIGS. 1A and 1B, one or more epitaxial layers 1 through N (e.g., where N≥1) are formed on the blocking layer. The one or more epitaxial layers may include a waveguide layer, a clad layer, a buffer layer, another blocking layer, and/or the like. For example, as shown in FIG. 1C, a buffer layer (shown as buffer layer 2) may be formed on the blocking layer and the one or more epitaxial layers may be formed on the buffer layer. As further shown in FIGS. 1A-1C, the one or more epitaxial layers may include a quantum-well layer. The quantum-well layer may function as an active region of the semiconductor layer structure (e.g., the quantum-well layer may act as an active semiconductor laser active region within a laser cavity when the semiconductor layer structure is included in a semiconductor laser device). In some implementations, the quantum-well layer may include a quantum-well intermixing region that is formed using a high temperature treatment. For example, the wafer that includes the semiconductor layer structure may be placed in a high temperature environment for a period of time to allow the quantum-well intermixing region to form. In some implementations, the blocking layer may suppress defects from propagating to the quantum-well layer and/or the quantum-well intermixing region. For example, the blocking layer may suppress defects from propagating to the quantum-well layer during formation of the quantum-well layer (e.g., before the high temperature treatment). As another example, the blocking layer may suppress defects from propagating to the quantum-well layer and/or the quantum-well intermixing region during formation of the quantum-well intermixing region (e.g., during the high temperature treatment).

The semiconductor layer structure shown in and described with respect to FIGS. 1A-1C may be used to form various types of devices. For example, the semiconductor layer structure may be used to form a semiconductor laser (e.g., a semiconductor diode laser), a light-emitting device, an optical device, and/or the like. In some implementations, a lasing wavelength of the device may be in an infrared (IR) range or a near-IR range (e.g., such as between 700 nm and 1000 nm). By including a thin blocking layer, the semiconductor layer structure shown in FIGS. 1A-1C provides improved control of lasing wavelength variability between different devices formed from different substrates from a same boule (e.g., when lasing at an $I_{op}$ and at room temperature, such as approximately 21 degrees Celsius, or another temperature as set by a thermoelectric cooler (TEC)). In some implementations, lasing wavelengths of laser devices formed from different substrates in the same boule may be measured under a same operational condition (e.g., a same current, a same heatsink temperature, and/or the like) in association with making this determination. For example, the improved control may maintain lasing wavelengths for devices formed from substrates with low slice numbers and devices formed from substrates with high slice numbers within a range, such as a 10 nm range, a 15 nm range, a 20 nm range, and/or the like (e.g., when lasing wavelengths of the devices formed from the substrates with low slice numbers, and the devices formed from the substrates with the high slice numbers, are measured under the same operational condition). As a result, the lasing wavelength may be independent of a slice position or a slice number of substrate in the boule (e.g., lasing wavelength control may facilitate use of devices formed from low slice numbers and/or high slice numbers, depending on the intended application). In this context, a lasing wavelength being independent of a slice position or slice number can be interpreted to mean that variation between the lasing wavelength and a lasing wavelength of another device formed from any other substrate of boule is less than a particular amount (e.g., 10 nm, 15 nm, 30 nm, or the like) regardless of slice positions or slice numbers of the pair of substrates.

In this way, some implementations described herein provide a semiconductor layer structure that includes a thin blocking layer. The thin blocking layer may suppress (e.g., reduce or eliminate) migration of defects from the substrate to the one or more epitaxial layers formed on the substrate via the thin blocking layer, which improves performance of devices formed using the semiconductor layer structure that includes the thin blocking layer. In addition, the semiconductor layer structure that includes the thin blocking layer provides improved control of wavelength variability across devices formed from substrates with different slice numbers from a boule. This improves production yield from a boule when using the boule to produce devices that lase within a narrow wavelength range (e.g., a range of 10 nm, 15 nm, 20 nm, and/or the like), thereby reducing costs and/or waste associated with device production.

As indicated above, FIGS. 1A-1C are provided merely as an example. Other examples may differ from what is described with regard to FIGS. 1A-1C.

Figure 2:
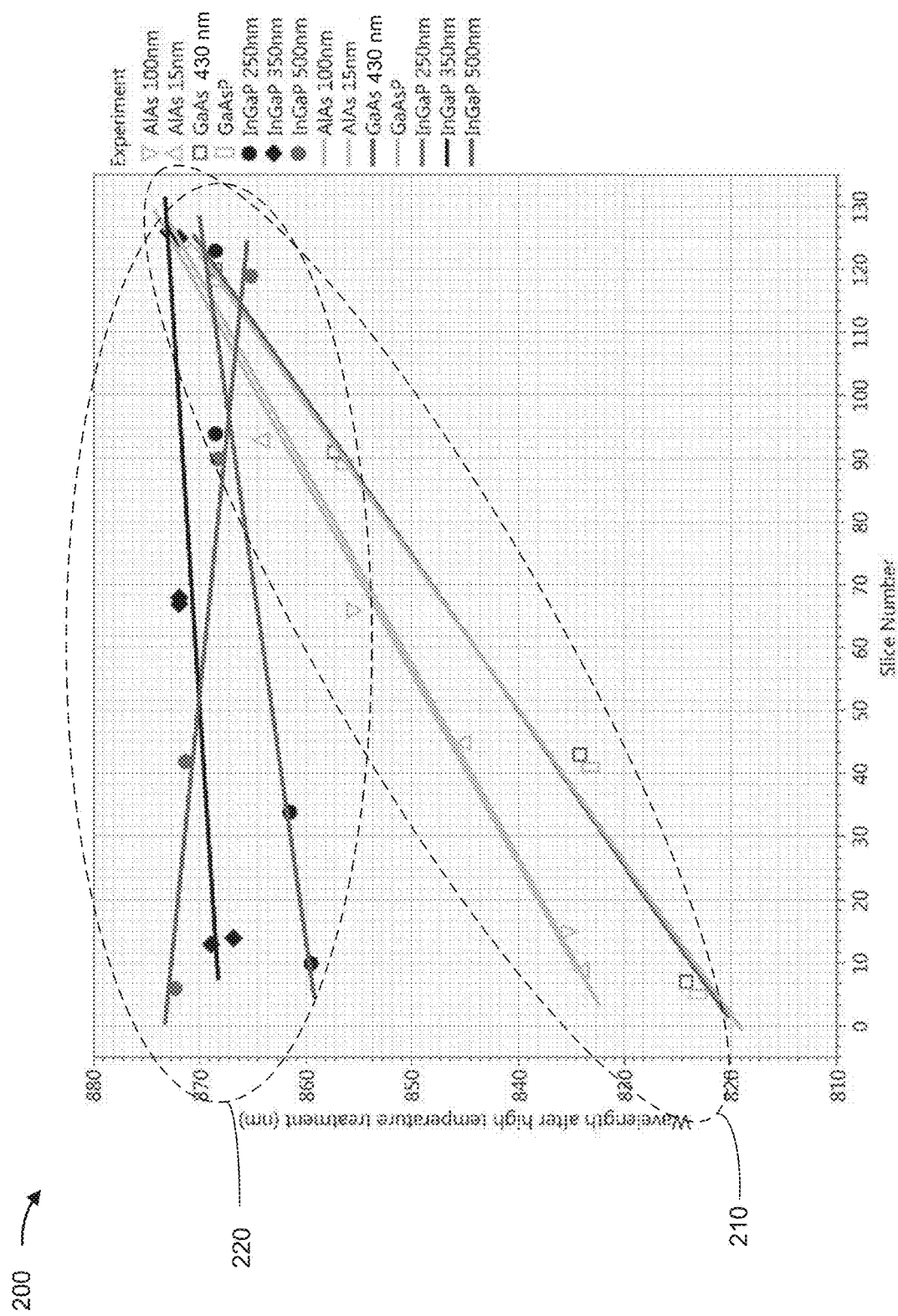
FIG. 2 is a diagram depicting a chart comparing various thicknesses and compositions of a blocking layer (e.g., for a semiconductor layer structure subjected to a high temperature treatment) and corresponding relationships between wavelength and slice number of a boule for the various thicknesses and compositions.

FIG. 2 is a diagram 200 depicting a chart comparing various thicknesses and compositions of a blocking layer (e.g., for a semiconductor layer structure subjected to a high temperature treatment described above in relation to FIGS. 1A-1C) and corresponding relationships between wavelength and slice number of a boule for the various thicknesses and compositions. For example, the chart shows a comparison of a relationship between wavelength and slice number for a semiconductor layer structure formed on a GaAs substrate that includes a thin blocking layer, such as a 100 nm thick AlAs layer, a 15 nm thick AlAs layer, a 430 nm thick GaAs layer, a GaAsP layer, a 250 nm thick InGaP layer, a 350 nm thick InGaP layer, and a 500 nm thick InGaP layer. The wavelengths shown in the chart of FIG. 2 occur when corresponding devices are at an operation current ($I_{op}$) (e.g., 10W) and at room temperature.

As further shown in the chart, each of the thin blocking layers may be categorized as belonging to a group 210 or a group 220. Group 210 includes the 100 nm thick AlAs layer, the 15 nm thick AlAs layer, the 430 nm thick GaAs control layer, and the GaAsP layer, and group 220 includes the 250 nm thick InGaP layer, the 350 nm thick InGaP layer, and the 500 nm thick InGaP layer. As shown in the chart, wavelength variation for a semiconductor layer structure formed using any of the thin blocking layers from group 210 may vary by about 53 nm (e.g., from a low end of approximately 820 nm to a high end of approximately 873 nm). In contrast, wavelength variation for a semiconductor layer structure formed using any of the thin blocking layers from group 220 is not greater than 15 nm (e.g., from a low end of approximately 859 nm to a high end of approximately 873 nm). Accordingly, some thin blocking layers (e.g., composed of InGaP or other materials with a similar epitaxial structure and/or lattice constant as InGaP, such as InAlP, InGaAs, AlInGaP, InGaAsP, and/or the like, described above in FIGS. 1A-1C) provide improved wavelength variability control when a device including the thin blocking layers is subject to a high temperature treatment.

As indicated above, FIG. 2 depicts one or more examples. Other examples may differ from what is described with regard to FIG. 2.

Figure 3:
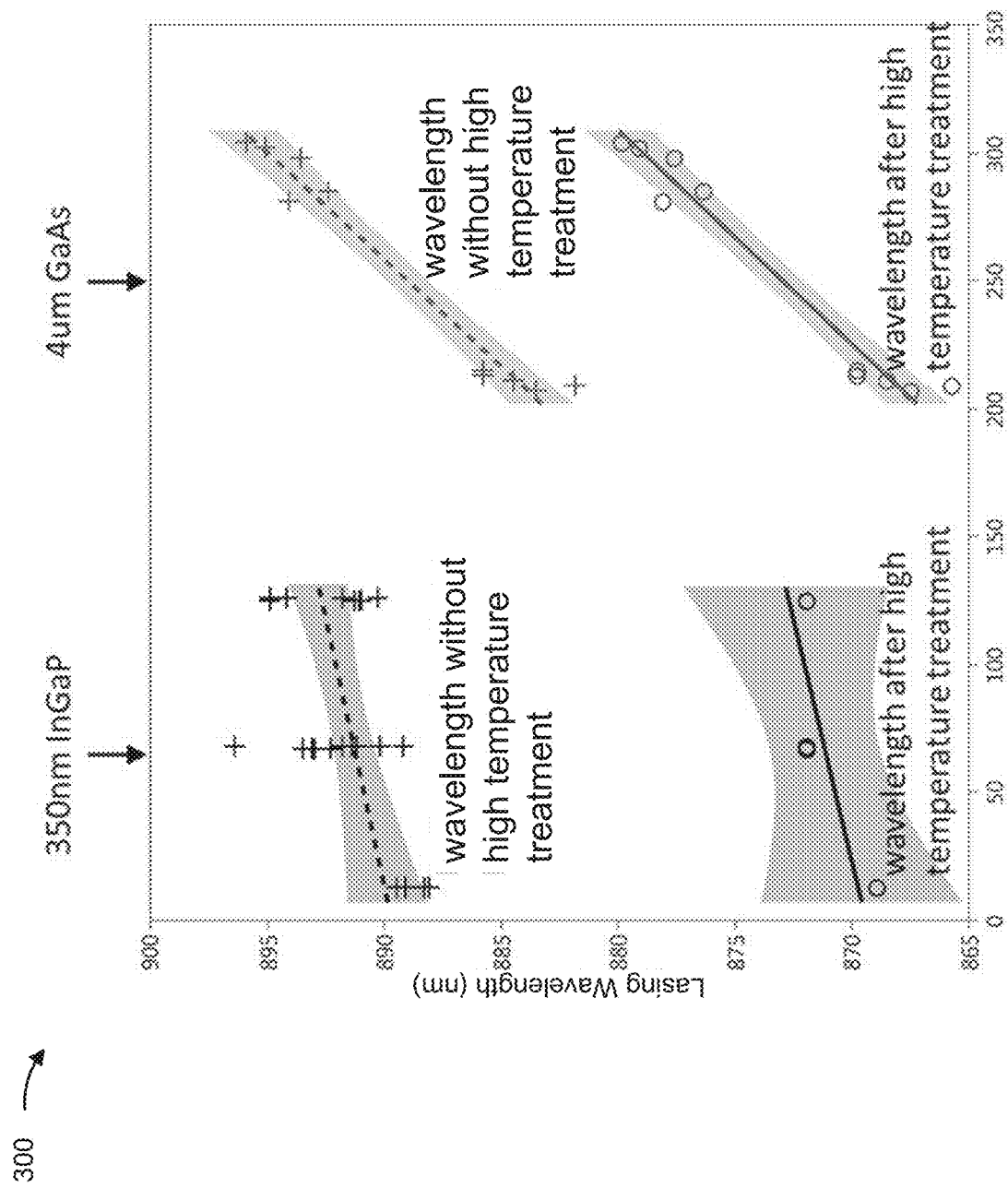
FIG. 3 is a diagram depicting a chart comparing various thicknesses and compositions of a blocking layer and a buffer layer and corresponding relationships between lasing wavelength and slice number of a boule for the various thicknesses and compositions.

FIG. 3 is a diagram 300 depicting a chart comparing various thicknesses and compositions of a blocking layer and a buffer layer and corresponding relationships between lasing wavelength and slice number of a boule for the various thicknesses and compositions. For example, the chart shows a comparison of a relationship between lasing wavelength and slice number for a semiconductor layer structure formed on a GaAs substrate that includes a 350 nm thick InGaP blocking layer (e.g., an example thin blocking layer as described herein) and a semiconductor layer structure formed on a GaAs substrate that includes a 3 μm GaAs buffer layer (e.g., a thick buffer layer as is typically used in conventional semiconductor layer structures) before and after the semiconductor layer structures are subject to a high temperature treatment. The lasing wavelengths shown in the chart of FIG. 3 occur when corresponding devices are lasing at an operation current ($I_{op}$) (e.g., 10W) and at room temperature, similar to that described elsewhere herein.

As further shown in the chart, the wavelength variation for a semiconductor layer structure formed using the 350 nm thick InGaP blocking layer without the high temperature treatment is about 8 nm (e.g., from a low end of approximately 887 nm to a high end of approximately 895 nm), while the wavelength variation for a semiconductor layer structure formed using the 3 μm GaAs buffer layer without the high temperature treatment is about 14 nm (e.g., from a low end of approximately 882 nm to a high end of approximately 896 nm). As additionally shown in the chart, the wavelength variation for the semiconductor layer structure formed using the 350 nm thick InGaP blocking layer after the high temperature treatment is about 3 nm (e.g., from a low end of approximately 868 nm to a high end of approximately 872 nm), while the wavelength variation for a semiconductor layer structure formed using the 3 μm GaAs buffer layer without the high temperature treatment is about 14 nm (e.g., from a low end of approximately 866 nm to a high end of approximately 880 nm). Accordingly, a device with a thin blocking layer (e.g., the 350 nm thick InGaP blocking layer) as described herein is able to provide improved wavelength variability control relative to a device with a thick buffer layer (e.g., the 3 μm GaAs buffer layer) before and after the device is subject to a high temperature treatment. In this way, a device with a thin blocking layer (e.g., a blocking layer that is less than 3 μm thick) may reduce wafer-by-wafer wavelength variation, which may reduce costs and waste, as described elsewhere herein.

As indicated above, FIG. 3 depicts one or more examples. Other examples may differ from what is described with regard to FIG. 3.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein the term "layer" is intended to be broadly construed as one or more layers and includes layers oriented horizontally, vertically, or at other angles.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method, comprising:
   forming a blocking layer over a substrate;
   forming a buffer layer over the blocking layer;
   forming one or more epitaxial layers over the buffer layer, wherein the one or more epitaxial layers include a quantum-well layer; and
   forming a quantum-well intermixing region, after forming the blocking layer, the buffer layer, and the epitaxial layers, by subjecting the quantum-well layer to a high temperature treatment of at least 500 degrees Celsius, wherein the blocking layer suppresses defects from the substrate propagating to the quantum-well intermixing region during the high temperature treatment.

2. The method of claim 1, wherein the blocking layer suppresses defects from the substrate propagating to the one or more epitaxial layers during formation of the quantum-well layer.

3. The method of claim 1, wherein the blocking layer comprises indium gallium phosphide (InGaP) that is no more than 350 nanometers thick.

4. The method of claim 1, wherein the blocking layer has a thickness of between 50 nanometers (nm) and 4000 nm.

5. The method of claim 1, wherein the substrate is a gallium arsenide (GaAs) substrate and the blocking layer includes at least one of:
   an indium gallium phosphide (InGaP) layer;
   an indium aluminum phosphide (InAlP) layer;
   an indium gallium arsenide (InGaAs) layer;
   an aluminum indium gallium phosphide (AlInGaP) layer; or
   an indium gallium arsenide phosphide (InGaAsP) layer.

6. The method of claim 1, wherein the blocking layer and the substrate are lattice-matched.

7. The method of claim 1, wherein the blocking layer comprises one or more super lattice layers.

8. The method of claim 1, wherein the one or more epitaxial layers include at least one of:
   a waveguide layer,
   a clad layer, or
   another buffer layer.

9. The method of claim 1, further comprising:
   doping, using an n-type dopant, the blocking layer with a flat doping profile or a graded doping profile.

10. The method of claim 1, further comprising:
    forming a plurality of emitters from the substrate, such that corresponding emitter wavelengths associated with each of the plurality of emitters are independent of a slice position or a slice number of the substrate from a boule.

11. A method of manufacturing one or more laser devices, comprising:
    forming a blocking layer over a substrate;
    forming a buffer layer over the blocking layer;
    forming one or more epitaxial layers over the buffer layer, wherein the one or more epitaxial layers include a quantum-well layer;
    forming a quantum-well intermixing region, after forming the blocking layer, the buffer layer, and the epitaxial layers, by subjecting the quantum-well layer to a high temperature treatment of at least 500 degrees Celsius, wherein the blocking layer suppresses defects from the substrate propagating to the quantum-well intermixing region during the high temperature treatment; and forming the one or more laser devices after forming the quantum-well intermixing region.

12. The method of claim 11, wherein the blocking layer suppresses defects from the substrate propagating to the one or more epitaxial layers during formation of the quantum-well layer.

13. The method of claim 11, wherein the blocking layer comprises indium gallium phosphide (InGaP) that is no more than 350 nanometers thick.

14. The method of claim 11, wherein the blocking layer has a thickness of between 50 nanometers (nm) and 4000 nm.

15. The method of claim 11, wherein the substrate is a gallium arsenide (GaAs) substrate and the blocking layer includes at least one of:
an indium gallium phosphide (InGaP) layer;
an indium aluminum phosphide (InAlP) layer;
an indium gallium arsenide (InGaAs) layer;
an aluminum indium gallium phosphide (AlInGaP) layer; or
an indium gallium arsenide phosphide (InGaAsP) layer.

16. The method of claim 11, wherein the blocking layer and the substrate are lattice-matched.

17. The method of claim 11, wherein the blocking layer comprises one or more super lattice layers.

18. The method of claim 11, wherein the one or more epitaxial layers include at least one of:
a waveguide layer,
a clad layer, or
another buffer layer.

19. The method of claim 11, further comprising:
doping, using an n-type dopant, the blocking layer with a flat doping profile or a graded doping profile.

20. The method of claim 11, wherein laser device wavelengths associated with the one or more laser devices are independent of a slice position or a slice number of the substrate from a boule.

* * * * *